March 4, 1958 C. W. MUELLER 2,825,667

METHODS OF MAKING SURFACE ALLOYED SEMICONDUCTOR DEVICES

Filed May 10, 1955

INVENTOR.
CHARLES W. MUELLER
BY J. L. Whittaker
ATTORNEY

United States Patent Office 2,825,667

Patented Mar. 4, 1958

2,825,667

METHODS OF MAKING SURFACE ALLOYED SEMICONDUCTOR DEVICES

Charles W. Mueller, Princeton, N. J., assignor to Radio Corporation of America, a corporation of Delaware Application May 10, 1955, Serial No. 507,421

21 Claims. (Cl. 148—1.5)

Figure 1:
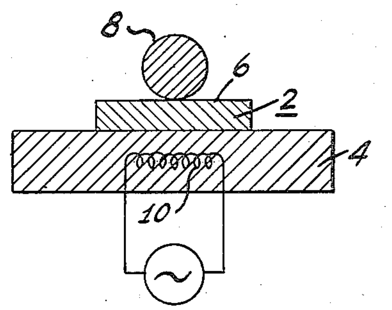

This invention relates to improved semiconductor devices and methods of making them. More particularly it relates to methods of making surface alloyed electrodes which incorporate rectifying barriers of improved geometrical configuration.

The manufacture of semiconductor devices such as crystal rectifiers and transistors may be relatively easily accomplished by means of the so-called surface alloy technique. One of the difficulties of this technique, however, is the tendency of a surface alloyed electrode to form a curved rather than a planar alloy front and rectifying junction. The difficulty is particularly apparent in the production of alloy junction transistors wherein an emitter electrode is surface alloyed to one face of a semiconductor base wafer and a collector electrode is surface alloyed to the opposite face in coaxial alignment with the emitter. In the normal course of the alloying process the two rectifying barriers thus formed are curved, being generally convex with respect to each other.

In such a device electric charge carriers emitted from different portions of the emitter barrier surface have different minimum diffusion path distances through the base wafer to the collector. Since the speed of travel of the charge carriers in the base is finite, this variation in minimum distance tends to limit the frequency response of the transistor and to distort a signal. It is, therefore, desirable to form surface alloyed rectifying barriers having as large a proportion of their areas as possible substantially flat, planar and controllably oriented with respect to each other.

Accordingly, one object of the instant invention is to provide improved methods of surface alloying.

Another object is to provide improved methods of making surface alloyed rectifying barriers in semiconductor bodies.

Another object is to provide improved methods of making surface alloyed rectifying barriers of substantially planar configuration.

Another object is to provide improved semiconductor devices including relatively large area rectifying barriers.

These and other objects are accomplished by the instant invention according to which surface alloyed rectifying barriers are formed within semiconductor bodies, the barriers being located substantially entirely upon single crystallographic planes of the semiconductor crystal. It is believed that a plane of a single crystal is one of the most perfect planes available in nature. According to the invention it has now been found that such barriers may be produced by first affixing electrode material to the surface of a semiconductor body under conditions insuring substantially perfect wetting.

The electrode is then alloyed into the semiconductor wafer by heating in a slightly oxidizing atmosphere. The oxidizing atmosphere forms a film upon the semiconductor surface which is not readily wetted by the electrode material. This film restricts the electrode to its initial area of contact and prevents it from spreading out beyond the initial contact area during the alloying process. It has now been unexpectedly found that an electrode restricted in this manner tends to advance through the crystal along a substantially planar front when it is melted in contact therewith.

By contrast, in previous surface alloying processes utilizing a non-oxidizing atmosphere a surface film is not formed on the semiconductor and the electrode tends to spread out upon the crystal surface as its temperature is increased and its surface tension reduced. One result of such spreading is to produce a rectifying barrier of concave shape with respect to the alloyed surface.

The invention will be explained in greater detail in connection with the accompanying drawing of which:

Figures 1–4 are schematic, cross-sectional, elevational views of a semiconductor wafer illustrating the production of a triode transistor according to the invention.

Similar reference characters have been applied to similar elements throughout the drawing.

An improved triode transistor may be made according to a preferred embodiment of the instant invention utilizing a wafer 2 of n-type conductivity semiconductive germanium as shown in Figures 1 through 4. The n-type germanium may be made by doping with very small amounts of antimony or arsenic, for example. The wafer is initially cut from a relatively large single crystal of germanium having a resistivity of about 0.5 to 5 ohm-cm. The wafer is cut so that its two large, opposite faces are substantially parallel to the [111] planes of the crystal. In size it may be about 0.1 x 0.1 x .01" thick. It is etched in a mixture of hydrofluoric and nitric acids saturated with iodine or bromine to reduce its thickness to about .005" and to provide a clean, crystallographically undisturbed surface.

The etched wafer is supported upon a heat-conducting member 4 which may be of any convenient material such as copper or carbon. The exposed surface 6 of the wafer is then wetted with a flux such as a water solution of zinc chloride. One satisfactory flux comprises about 22 grams zinc chloride in 100 ml. of water to which is added about 5 drops of an organic wetting agent and 6 drops of concentrated hydrochloric acid. A pellet 8 of indium is also wetted with the same or a similar flux and placed upon the surface of the wafer.

The pellet may be of any desired shape and of any size compatible with the size of the wafer. It is preferred, however, in order to provide uniformity of results and increased reproducibility to form the pellets into small spheres. The size of the junction formed in the wafer will be determined by the size of the pellet as well as by the temperature to which it is heated in the alloy process. It has been found that the size of the pellets can be most accurately controlled by forming them into spheres which may be sorted by screening or individually measured by observing them under a calibrated microscope. A typical pellet may be about .020" in diameter when utilized to form a collector electrode according to the instant embodiment of the invention.

The ensemble is then heated to about 300° C. by applying heat to the supporting member 4. The heating may be accomplished by any convenient means such as the electric heating coil 10. Electrical heating means are, of course, preferred since, in general, such means are adaptable to a relatively close degree of control. A thermocouple (not shown) may be inserted in the supporting member 4 to measure and to permit accurate control of the temperature of heating.

Figure 2:
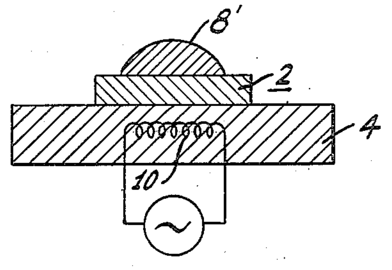

The indium melts at about 150° C. but even at temperatures up to 300° C. and higher dissolves only minute proportions of germanium. The flux operates to induce wetting of the germanium by the indium causing the indium sphere to flatten out upon the germanium wafer and to adhere firmly thereto as shown in Figure 2.

This heating may be carried out in an inert, reducing or ordinary air atmosphere as desired or as determined in view of collateral considerations such as the composition and refractivity of the vessel used to hold the device. The amount of flux present on the indium pellet and the germanium wafer is preferably limited to the quantity required to provide adequate wetting of the germanium by the indium. The flux dissolves some of the indium and spreads it upon the germanium surface beyond the electrode contact area thus contaminating the surface. The quantity of flux is therefore minimized in order to minimize such contamination.

The degree of flattening of the electrode material may be controlled by varying the temperature of the heating step, higher temperatures producing greater flattening. When indium is used the temperature is preferably limited to about 250° to 350° C. to provide a substantial thickness of indium above the germanium surface, forming a hat-like profile.

The quantity of indium present per unit area of contact surface between the indium and germanium is a controlling parameter of the depth to which the indium will alloy into the wafer in the subsequent "alloying-in" process step. Excessive flattening and spreading of the indium pellet is preferably avoided because a substantial thickness of indium is required to permit relatively deep alloy penetration. The depth of penetration may then be controlled within relatively broad limits by varying the temperature utilized in the "alloy-in" step. A relatively thick indium electrode is desirable also because it provides a better anchorage for an electrical lead wire than does a relatively thin one.

The initial heating step to affix the indium pellet to the germanium wafer may be referred to as the "solder-down" step since the electrode is affixed by a relatively low temperature melting to the surface of the germanium.

After the "solder-down" step the unit is cooled and rinsed in methanol or preferably in a 2% solution of concentrated nitric acid in methanol. It is then dipped for a second or so into a solution of one part nitric acid, one part hydrofluoric acid and 8 parts water by volume. The rinsing and the acid dip remove substantially all the salts left by the flux and also serve to clean the surface of other contamination. In particular, it is desirable to remove any indium, zinc or other contaminants which may have been deposited upon the exposed surface of the germanium wafer adjacent to the electrode.

The unit is then heated at a relatively slow rate to about 550° C. and subsequently cooled again at a slow rate down to a temperature of about 300° C. whereupon the rate of cooling may be accelerated. Although the rate of heating and cooling is not critical in the practice of the invention, more uniform results and a higher degree of flatness of the barriers are provided when the heating and the initial cooling are controlled to a rate of about 20° C. per minute or slower. This heating step is accomplished in a slightly oxidizing atmosphere such as the ordinary commercial grades of helium or nitrogen which include small proportions of moisture and oxidizing gases. The step may also be carried out in an air atmosphere but this tends to produce a relatively heavy film of oxide on the indium which impedes the subsequent attaching of leads thereto. The step should not, however, be carried out in a reducing or completely inert atmosphere such as an atmosphere of dry hydrogen because in such an atmosphere the indium may spread further upon the surface beyond the area covered during the solder-down step. An atmosphere with at least slightly oxidizing characteristics tends to produce an oxide film on the surface of the germanium which is not readily wetted by the indium and which, therefore, serves to restrict the indium electrode to its initial position only.

During the second heating step which may be called the "alloy-in" step the indium dissolves substantial portions of the germanium and forms a liquid pool extending into the germanium wafer. The maximum depth of penetration of the liquid pool may be controlled by varying the firing temperature. The solubility of germanium in indium and other electrode materials is a direct function of temperature. As the temperature is increased additional quantities of germanium are dissolved in the molten electrode and the liquid pool advances into the wafer.

Figure 3:
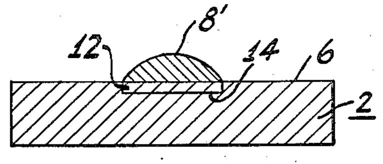

Upon cooling, the dissolved germanium recrystallizes forming a recrystallized region 12 in the wafer immediately adjacent to the electrode 8′, Figure 3. Only relatively small proportions of the dissolved germanium remain in the indium electrode, substantially all of it being redeposited within the wafer during the slow cooling. The redeposited germanium includes significant proportions of dissolved indium which convert its conductivity type from n to p, thus forming a p–n rectifying barrier 14 in the wafer approximately at the surface of maximum penetration of the molten electrode.

Unexpectedly it has been found that in the practice of the invention the penetration of the indium into the germanium wafer takes place in an extremely regular fashion so that the alloy front, i. e., the surface of maximum penetration of the indium maintains a substantially planar configuration. The orientation of the alloy front appears to be determined by the [111] crystal planes of the germanium and not by the surface of the wafer.

In the drawing the single line 14 represents both the alloy front and the p–n rectifying junction and is shown parallel to the surface 6 of the wafer. In an actual practical device, however, the surface 6 of the wafer may differ by a few degrees from perfect parallelism with the planes of the crystal in which case the alloy front 14 would be aligned with the crystal planes rather than with the surface of the wafer.

Figure 4:
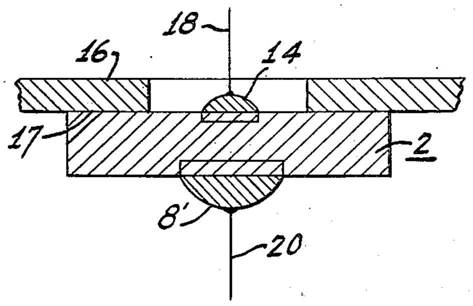

The wafer bearing the surface alloyed electrode is then inverted and a second smaller electrode 14 is surface alloyed by a similar process to the opposite side of the wafer in coaxial alignment with the first electrode. This electrode is formed from an indium sphere about .010″ in diameter so that it is substantially smaller than the first electrode. The device is then etched in a nitric acid-hydrofluoric acid water solution and soldered upon a base tab 16 by a non-rectifying solder connection 17 (Figure 4). Electrical leads 18 and 20 are connected to the respective electrodes and the device may then be conventionally mounted and potted.

Alternatively, both the electrodes may be soldered-down and alloyed-in simultaneously instead of consecutively. The surface tension of the flux is sufficient to hold the relatively small electrode pellets in place on the semiconductor wafer so that the one on the bottom will not fall off when the wafer is inverted.

When the device is incorporated in a circuit as a triode transistor the larger electrode 8′ may advantageously be utilized as a collector electrode and the smaller electrode 14 as an emitter electrode. The tab 16 serves as a base connection.

The specific dimensions of devices and the elements thereof made according to the invention are not critical and are not essential features of the invention. One feature of the invention is the two-step process of first soldering-down and then alloying-in an electrode upon a semiconductor body. Unexpectedly it has been found that this two-step process produces rectifying barriers of exceedingly planar configuration.

The size of the barrier and its depth beneath the original surface of the semiconductor body may be controllably varied within wide limits. The size of the barriers is limited only by the size of available single crystal bodies of semiconductor material. Their depth beneath the surface may be controlled, as explained heretofore, by varying the quantity of impurity material utilized per unit area of the barriers and by varying the temperature at which the alloy-in step is carried out. In general, the greater the quantity of electrode material per unit area and the higher the temperature of the alloy-in step, the deeper will be the barrier.

According to a second feature of the invention a soldered-down electrode may be utilized as a rectifying barrier device without any further heat treatment. The semiconductor body 2 with the soldered-down electrode 8′ as shown in Figure 2 may be utilized as a crystal rectifier. In this device the barrier lies in the crystal body microscopically close to the interface between the crystal and the electrode. Satisfactory transistor devices may be made utilizing two such soldered-down electrodes coaxially aligned upon opposite faces of extremely thin wafers such as about .0005″ to .002″ thick.

Combinations of the different electrodes according to the invention may also be utilized to make transistors and other devices. For example, a collector electrode may be surface alloyed according to the two-step process heretofore described upon a .004″ thick wafer to a depth of about .003″. Upon the opposite surface of the wafer and coaxially aligned with the collector electrode there may then be soldered down an emitter electrode having substantially no penetration into the wafer.

Other combinations may be devised according to the particular purposes to which the devices are to be put. It is not, of course, necessary to restrict such devices to coaxially aligned and oppositely disposed electrode pairs. Any desired electrode arrangement may be used such as one comprising a plurality of electrodes upon one surface of a semiconductive body.

The particular flux recited in connection with the preferred embodiment herein is not critical in the practice of the invention. In general, any flux capable of cleaning the electrode material and the semiconductor body may be utilized. In the case of indium and germanium, fluxes comprising zinc chloride have been found to be most effective. Many different specific zinc chloride fluxes have been tested and found to provide satisfactory results. The particular flux heretofore described is known to work well and with a high degree of reliability.

The invention is not limited to the particular semiconductor material and electrode material described heretofore in connection with the preferred embodiment. It is equally applicable to all known crystalline semiconductive materials that are available in the form of single crystals sufficiently large to comprise a base wafer of a device. For example, the principles of the invention are applicable in forming rectifying barriers in semiconductive materials such as germanium, silicon, indium antimonide, cadmium telluride, gallium arsenide, indium phosphide and aluminum antimonide. Any desired electrode material may be utilized that is capable of dissolving the semiconductive material to which it is surface alloyed at temperatures below the melting point of the semiconductor. For example, indium may be used to form an electrode in any of the above named semiconductive materials, and also alloys of lead with bismuth, antimony, arsenic or phosphorus or metals such as copper, zinc, cadmium, gallium, aluminum or alloys of two or more of these metals. It will be seen, therefore, that the practice of the invention may be utilized to produce rectifying barriers in semiconductive materials of either conductivity type, n or p, or in semiconductors of balanced conductivity such as intrinsically pure materials.

Examples of further specific electrode materials and semiconductors are shown in the following table. In each case the resulting rectifying barriers are substantially flat and exhibit improved characteristics as compared to previous barriers prepared by the conventional, single firing step process. A flux similar to that described in connection with the preferred embodiment herein may be used in each of the examples, with the one exception noted. Compositions are given in terms of weight percents.

*Table*

| Semiconductor Material | | Electrode Material Composition | Solder-Down Temp., ° C. | Alloy-In Temp., ° C. |
|---|---|---|---|---|
| Composition | Conductivity Type | | | |
| Germanium | n-type | 95% Indium<br>5% Germanium | 300 | 550 |
| Do | p-type | 90% Lead<br>10% Antimony | 400 | 650 |
| Do | p-type | 90% Lead<br>10% Arsenic | 400 | 650 |
| 93% Germanium<br>7% Silicon | n-type | 95% Indium<br>5% Zinc | 400 | 650 |
| Silicon* | p-type | 75% Gold<br>25% Antimony | 500 | 800 |

*Flux was film of fluorine-containing salt on electrode pellet.

Generally an electrode according to the invention is placed upon a semiconductor surface that is approximately parallel to crystal planes of minimum chemical reactivity. In materials such as germanium which comprise the diamond lattice structure these planes are usually the ones known as [111] planes. In other materials such as galena, with a sodium chloride structure, and cadmium sulfide, tellurium and selenium, with hexagonal structures, the corresponding crystal planes may be identified as those which etch most slowly under chemical attack. Such surfaces are selected because the alloying-in of an electrode according to the invention is controlled primarily by these relatively refractory crystal planes, the alloy front of the electrode tending to coincide with one of them.

In general the solder-down step of the invention may be accomplished by heating an electrode material in contact with a single crystal of a semiconductor material to a temperature higher than the melting point of the electrode material but below the temperature at which the electrode material dissolves substantial proportions of the semiconductor material. The alloying-in step, when utilized, is then carried out at a temperature substantially in excess of the soldering-down temperature, a temperature at which the electrode material dissolves substantial proportions of the semiconductor material. For convenience, in controlling the operation, it is preferred to avoid combinations of electrode materials and semiconductor materials which form eutectic systems, such as the germanium-aluminum system. If such combinations are utilized, however, the heating in the solder-down step may be carried out at any temperature above the melting point of the eutectic and, optionally, below the melting point of the electrode material itself.

The heating in both of the steps may be carried out in a furnace as well as on a hot plate. The apparatus for heating is not critical. The hot plate is shown and described herein because it is believed to be a convenient method of controllably heating the devices of the invention.

The etching compositions heretofore described are not critical in the practice of the invention. Any known method of etching the semiconductor material may be substituted. For example, etching of germanium devices may be alternatively accomplished by electrolytic etching in alkaline solutions. Different etchants will, of course, be preferred according to the particular materials of the particular device being made.

The principal emphasis in this specification has been placed upon the benefits accruing from the use of the invention in making transistor devices wherein two rectifying barriers in a single wafer of semiconductive material are opposed in electrically cooperative relationships. The advantages of the invention, however, are not restricted to these devices. Other devices such as diodes which comprise single rectifying barriers in semiconductor bodies or relatively complex, multi-element devices are also improved by the practice of the invention. The exact reasons for the improvement in individual junctions which manifests itself in improved breakdown and reverse current characteristics are not definitely understood. It is believed, however, that the improved characteristics probably result from the absence of very thin "feather edges" around the periphery of the recrystallized region and also from the improved uniformity of thickness of the recrystallized region over its entire area.

There have thus been described improved semiconductor devices and methods of making them, which devices comprise flat, substantially planar rectifying barriers disposed in single crystal wafers of semiconductive materials.

What is claimed is:

1. Method of making a semiconductor device comprising the steps of first affixing a body of a conductivity type determining electrode material to the surface of a crystalline semiconductive body by heating said electrode body and said semiconductive body together to a temperature above the melting point of the lowest melting point composition in the alloy system comprising said electrode body material and said semiconductive body material, and subsequently heating said electrode body and said semiconductive body to a second temperature higher than said aforementioned temperature in an oxidizing atmosphere thereby to dissolve a surface portion of said semiconductor body in said electrode material and to form a rectifying barrier in said semiconductive body.

2. Method of making a semiconductor device comprising the steps of first affixing an electrode body to the surface of a crystalline semiconductive body of one conductivity type, said electrode body comprising a substance capable of imparting conductivity of a type opposite to said one type to said semiconductive body when dispersed therein, said affixing step comprising heating said electrode body and said semiconductive body to a temperature above the melting point of the lowest melting point composition in the alloy system comprising said electrode body material and said semiconductive body material, and subsequently heating said electrode body and said semiconductive body to a second temperature higher than said aforementioned temperature in an oxidizing atmosphere thereby to dissolve a surface portion of said semiconductive body in said electrode body and to form a rectifying barrier in said semiconductive body.

3. Method of making a semiconductor device comprising the steps of first affixing an electrode body consisting essentially of indium to a surface of an n-type semiconductive germanium body by heating said electrode body and said germanium body to a temperature of about 250° to 350° C., and subsequently heating said electrode body and said germanium body to a temperature higher than 350° C. in an oxidizing atmosphere thereby to dissolve a surface portion of said germanium body in said electrode body and to form a rectifying barrier in said germanium body.

4. Method of making a semiconductor device comprising the steps of first affixing an electrode body consisting essentially of by weight 95% indium and 5% germanium to a surface of an n-type semiconductive germanium body by heating said electrode body and said germanium body together to a temperature of about 300° C., and subsequently heating said electrode body and said germanium body to about 550° C. in an oxidizing atmosphere thereby to dissolve a surface portion of said germanium body in said electrode body and to form a rectifying barrier in said germanium body.

5. Method of making a semiconductor device comprising the steps of first affixing an electrode body consisting essentially of by weight 90% lead and 10% antimony to a surface of a p-type semiconductive germanium body by heating said electrode body and said germanium body together to a temperature of about 400° C., and subsequently heating said electrode body and said germanium body to about 650° C. in an oxidizing atmosphere thereby to dissolve a surface portion of said germanium body in said electrode body and to form a rectifying barrier in said germanium body.

6. Method of making a semiconductor device comprising the steps of first affixing an electrode body consisting essentially of by weight 90% lead and 10% arsenic to a surface of an n-type semiconductive germanium body by heating said electrode body and said germanium body together to a temperature of about 300° C., and subsequently heating said electrode body and said germanium body to about 550° C. in an oxidizing atmosphere thereby to dissolve a surface portion of said germanium body in said electrode body and to form a rectifying barrier in said germanium body.

7. Method of making a semiconductor device comprising the steps of first affixing an electrode body consisting essentially of by weight 95% indium and 5% zinc to a surface of an n-type semiconductive body consisting essentially of an alloy of germanium and silicon by heating said electrode body and said semiconductive body together to a temperature of about 300° C., and subsequently heating said electrode body and said semiconductive body to about 550° C. in an oxidizing atmosphere thereby to dissolve a surface portion of said semiconductive body in said electrode body and to form a rectifying barrier in said semiconductive body.

8. Method of making a semiconductor device comprising the steps of first affixing an electrode body consisting essentially of by weight 75% gold and 25% antimony to a surface of a p-type semiconductive silicon body by heating said electrode body and said silicon body together to a temperature of about 500° C., and subsequently heating said electrode body and said silicon body to about 800° C. in an oxidizing atmosphere thereby to dissolve a surface portion of said silicon body in said electrode body and to form a rectifying barrier in said silicon body.

9. Method of making a semiconductor device comprising the steps of first affixing an indium electrode body to the surface of an n-type semiconductive germanium body by heating said electrode body and said germanium body together in the presence of a flux to a temperature below about 350° C., and subsequently heating said germanium body with said electrode body affixed thereto to a temperature higher than said aforementioned temperature in an oxidizing atmosphere thereby to dissolve a surface portion of said germanium body in said electrode body and to form a rectifying barrier in said germanium body.

10. Method of making a semiconductor device comprising the steps of first affixing an indium electrode to a surface of a single crystal semiconductive germanium body, said surface being substantially parallel to [111] crystallographic planes of said germanium body, said affixing comprising heating said electrode in contact with said surface to a temperature of about 250° C. to 350° C. in the presence of a flux thereby to cause said electrode to melt upon said surface and to wet a selected portion thereon, and subsequently heating said germanium body with said electrode affixed thereto to a second temperature higher than said aforementioned temperature in an oxidizing atmosphere thereby to dissolve a surface portion of said germanium body in said electrode and to form a rectifying barrier in said germanium body, the major area of said rectifying barrier being substantially contiguous with a [111] crystallographic plane of said germanium body.

11. Method of making a semiconductor device comprising the steps of first affixing a conductivity type determining electrode body to a surface of a single crystal semiconductive body, said semiconductive body having a diamond lattice structure and said surface being substantially parallel to [111] crystallographic planes of said lattice, said affixing comprising heating said electrode in contact with said surface to a temperature of about 250° to 350° C. in the presence of a flux thereby to cause said electrode to melt upon said surface and to wet a selected portion thereon, and subsequently heating said semiconductive body with said electrode affixed thereto to a second temperature higher than said aforementioned temperature in an oxidizing atmosphere thereby to dissolve a surface portion of said semiconductive body in said electrode and to form a rectifying barrier in said semiconductive body, the major area of said rectifying barrier being substantially contiguous with a [111] crystallographic plane of said semiconductive body.

12. Method of making a semiconductor device comprising the steps of first affixing a conductivity type determining electrode body to a surface of a single crystal semiconductive body, said semiconductive body having a diamond lattice structure, and said surface being substantially parallel to [111] crystallographic planes of said lattice, said planes being those which etch most slowly under chemical attack, said affixing comprising heating said electrode in contact with said surface in the presence of a flux to a temperature above the melting point of the lowest melting point composition in the alloy system comprising said electrode body material and said semiconductive body material thereby to cause said electrode to melt upon said surface and to wet a selected portion thereon, and subsequently heating said semiconductive body with said electrode body affixed thereto to a second temperature higher than said aforementioned temperature in an oxidizing atmosphere thereby to dissolve a surface portion of said semiconductive body in said electrode body and to form a rectifying barrier in said semiconductive body, the major area of said rectifying barrier being substantially contiguous with one of said crystallographic planes of said semiconductive body.

13. Method of making a semiconductor device comprising the steps of first affixing a body of conductivity- type-determining electrode material to a surface of a crystalline semiconductive body by heating said electrode body and said semiconductive body together to a temperature above the melting point of the lowest melting point composition in the alloy system comprising said electrode body material and said semiconductive body material, cooling the assembly of semiconductive body and electrode body, and subsequently heating said assembly of said electrode body and said semiconductive body to a second temperature higher than said aforementioned temperature in an oxidizing atmosphere thereby to dissolve a surface portion of said semiconductor body and said electrode material and to form a rectifying barrier in said semiconductive body.

14. Method of making a semiconductor device comprising the steps of first affixing an electrode body to a surface of a crystalline semiconductive body of one conductivity type, said electrode body comprising a substance capable of imparting conductivity of a type opposite to said one type to said semiconductive body when dispersed therein, said affixing step comprising heating said electrode body and said semiconductive body to a temperature above the melting point of the lowest melting point composition in the alloy system comprising said electrode body material and said semiconductive body material, cooling the assembly of said semiconductive body and said electrode body, and subsequently heating said assembly of said electrode body and said semiconductive body to a second temperature higher than said aforementioned temperature in an oxidizing atmosphere thereby to dissolve a surface portion of said semiconductive body in said electrode body and to form a rectifying barrier in said semiconductive body.

15. Method of making a semiconductor device comprising the steps of first affixing an electrode body consisting essentially of indium to a surface of an N-type semiconductive germanium body by heating said electrode body and said germanium body to a temperature of about 250°–350° C., cooling the assembly of indium electrode and germanium body, and subsequently heating said assembly of said indium electrode and said germanium body to a temperature higher than 350° C. in an oxidizing atmosphere hereby to dissolve a surface portion of said germanium body in said electrode body and to form a rectifying barrier in said germanium body.

16. Method of making a semiconductor device comprising the steps of first affixing an electrode body consisting essentially of by weight 90 percent lead and 10 percent antimony to a surface of a P-type semiconductive germanium body by heating said electrode body and said germanium body together to a temperature of about 400° C., cooling the assembly of said electrode and said germanium body, and subsequently heating said electrode body and said germanium body to about 650° C. in an oxidizing atmosphere thereby to dissolve a surface portion of said germanium body and to form a rectifying barrier in said germanium body.

17. Method of making a semiconductor device comprising the steps of first affixing an electrode body consisting essentially of by weight 90 percent lead and 10 percent arsenic to a surface of a P-type semiconductive germanium body by heating said electrode body and said germanium body together to a temperature of about 300° C., cooling the assembly of said electrode body and said germanium body, and subsequently heating said electrode body and said germanium body to about 550° C. in an oxidizing atmosphere thereby to dissolve a surface portion of said germanium body in said electrode body and to form a rectifying barrier in said germanium body.

18. Method of making a semiconductor device comprising the steps of first affixing an indium electrode body to the surface of an N-type semiconductive germanium body by heating said electrode body and said germanium body together in the presence of a flux to a temperature below about 350° C., cooling the assembly of said indium electrode and said germanium body, and subsequently heating said germanium body with said electrode body affixed thereto to a temperature higher than said aforementioned temperature in an oxidizing atmosphere thereby to dissolve a surface portion of said germanium body in said electrode body and to form a rectifying barrier in said germanium body.

19. Method of making a semiconductor device comprising the steps of first affixing an indium electrode to a surface of a single crystal semiconductive germanium body, said surface being substantially parallel to [111] crystallographic planes of said germanium body, said affixing comprising heating said electrode in contact with said surface to a temperature of about 250° C. to 350° C. in the presence of a flux thereby to cause said electrode to melt upon said surface and to wet a selected portion thereon, cooling the assembly of said electrode and said germanium body, and subsequently heating said germanium body with said electrode affixed thereto to a second temperature higher than said aforementioned temperature in an oxidizing atmosphere thereby to dissolve a surface portion of said germanium body in said electrode and to form a rectifying barrier in said germanium body, the major area of said rectifying barrier being substantially contiguous with a [111] crystallographic plane of said germanium body.

20. Method of making a semiconductor device comprising the steps of first affixing a conductivity type-determining electrode body to a surface of a single crystal semiconductive body, said semiconductive body having a diamond lattice structure and said surface being substantially parallel to [111] crystallographic planes of said lattice, said affixing comprising heating said electrode in contact with said surface to a temperature of about 250° to 350° C. in the presence of a flux thereby to cause said electrode to melt upon said surface and to wet a selected portion thereon, cooling the assembly of said electrode and said body, and subsequently heating said semiconductive body with said electrode affixed thereto to a second temperature higher than said aforementioned temperature in an oxidizing atmosphere thereby to dissolve a surface portion of said semiconductive body in said electrode and to form a rectifying barrier in said semiconductive body, the major area of said rectifying barrier being substantially contiguous with a [111] crystallographic plane of said semiconductive body.

21. Method of making a semiconductor device comprising the steps of first affixing a conductivity type-determining electrode body to a surface of a single crystal semiconductive body, said semiconductive body having a diamond lattice structure, and said surface being substantially parallel to [111] crystallographic planes of said lattice, said affixing comprising heating said electrode in contact with said surface in the presence of a flux to a temperature above the melting point of the lowest melting point composition in the alloy system comprising said electrode body material and said semiconductive material thereby to cause said electrode to melt upon said surface and to wet a selected portion thereon, cooling the assembly of said electrode and said semiconductive body, and subsequently heating said semiconductive body with said electrode body affixed thereto to a second temperature higher than said aforementioned temperature in an oxidizing atmosphere thereby to dissolve a surface portion of said semiconductive body in said electrode body and to form a rectifying barrier in said semiconductive body, the major area of said rectifying barrier being substantially contiguous with one of said crystallographic planes of said semiconductive body.

References Cited in the file of this patent

UNITED STATES PATENTS

| | | |
|---|---|---|
| 2,644,852 | Dunlap | July 7, 1953 |
| 2,742,383 | Barnes et al. | Apr. 17, 1956 |
| 2,761,800 | Ditrick | Sept. 4, 1956 |

FOREIGN PATENTS

| | | |
|---|---|---|
| 506,110 | Belgium | Oct. 15, 1951 |